US010617155B2

(12) United States Patent
Komoto et al.

(10) Patent No.: US 10,617,155 B2
(45) Date of Patent: Apr. 14, 2020

(54) CONNECTOR ATTACHED ON OPPOSITE SIDES OF GARMENT AND SANDWICHED BETWEEN CONNECTOR FIRST MEMBER AND CONNECTOR SECOND MEMBER

(71) Applicant: Japan Aviation Electronics Industry, Limited, Tokyo (JP)

(72) Inventors: Tetsuya Komoto, Tokyo (JP); Keisuke Nakamura, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 16/166,815

(22) Filed: Oct. 22, 2018

(65) Prior Publication Data

US 2019/0166924 A1 Jun. 6, 2019

(30) Foreign Application Priority Data

Dec. 5, 2017 (JP) .................. 2017-233144

(51) Int. Cl.
*A41D 1/00* (2018.01)
*H01R 13/62* (2006.01)
(Continued)

(52) U.S. Cl.
CPC ........... *A41D 1/005* (2013.01); *H01R 12/675* (2013.01); *H01R 13/04* (2013.01); *H01R 13/22* (2013.01);
(Continued)

(58) Field of Classification Search
CPC ..................................................... A41D 1/005
(Continued)

(56) References Cited

U.S. PATENT DOCUMENTS

| 573,532 A | * | 12/1896 | Pringle | ............. A44B 17/0052 |
| | | | | 24/681 |
| 3,975,803 A | * | 8/1976 | Katayama | ......... A44B 17/0011 |
| | | | | 24/689 |

(Continued)

FOREIGN PATENT DOCUMENTS

| FR | 2835973 A1 | 8/2003 |
| JP | 2017-182897 A | 10/2017 |
| WO | WO2010024613 A2 | 3/2010 |

*Primary Examiner* — Tulsidas C Patel
*Assistant Examiner* — Peter G Leigh
(74) *Attorney, Agent, or Firm* — Muncy, Geissler, Olds & Lowe, P.C.

(57) ABSTRACT

A connector includes a first member and a second member sandwiching an attachment portion of a garment having a conductive member, the first member having a first garment retaining portion to be contacted with one surface of the attachment portion and a projection made of a conductive material and disposed in a position different from the first garment retaining portion to project in a direction perpendicular to the first garment retaining portion, the second member having a second garment retaining portion to be contacted with the other surface of the attachment portion and a projection accommodating portion disposed in a position different from the second garment retaining portion, the projection having a slit extending in the direction perpendicular to the first garment retaining portion, and when the projection is fitted into the projection accommodating portion, the projection is electrically connected to the conductive member.

7 Claims, 10 Drawing Sheets

(51) Int. Cl.
  *H01R 13/24* (2006.01)
  *H01R 13/73* (2006.01)
  *H01R 24/86* (2011.01)
  *H01R 13/66* (2006.01)
  *H01R 12/67* (2011.01)
  *H01R 13/04* (2006.01)
  *H01R 13/22* (2006.01)
  *H01R 107/00* (2006.01)
  *H05K 1/03* (2006.01)

(52) U.S. Cl.
  CPC ............ *H01R 13/24* (2013.01); *H01R 13/62* (2013.01); *H01R 13/665* (2013.01); *H01R 13/73* (2013.01); *H01R 24/86* (2013.01); *H01R 2107/00* (2013.01); *H05K 1/038* (2013.01)

(58) Field of Classification Search
  USPC ............................................. 439/37
  See application file for complete search history.

(56) References Cited

U.S. PATENT DOCUMENTS 4,562,624 A  *  1/1986  Kanzaka ............ A44B 17/0029
                                                                24/621
  4,847,959 A  *  7/1989  Shinnada ........... A44B 17/0011
                                                                24/671
  5,003,673 A  *  4/1991  Nysten ............... A44B 17/0005
                                                                24/662
  5,440,461 A  *  8/1995  Nadel ................... A41D 27/085
                                                                362/103
  5,455,749 A  *  10/1995 Ferber ................... A41D 1/005
                                                                362/103
  5,722,130 A  *  3/1998  Baader .................. A44B 17/00
                                                                24/662
  6,170,135 B1 *  1/2001  Pferdehirt ............ A44B 17/007
                                                                24/687
  6,319,015 B1 *  11/2001 Faunce ................. H01R 11/22
                                                                24/662
  6,350,129 B1 *  2/2002  Gorlick .................. H01R 4/48
                                                                439/37
  6,474,830 B1 *  11/2002 Hansen .................. A44B 1/04
                                                                362/103
  7,160,047 B2 *  1/2007  Mueller ............... B23P 19/062
                                                                29/512
  7,210,939 B2 *  5/2007  Marmaropou ......... A41D 1/005
                                                                2/69
  8,259,460 B2 *  9/2012  Bhattacharya ......... H05K 3/301
                                                                174/260
  8,465,316 B2 *  6/2013  Chung ................ H01R 12/675
                                                                439/271
  8,561,269 B2 *  10/2013 LeCompte ......... A44B 17/0005
                                                                24/108
  8,647,129 B2 *  2/2014  Takahashi ........... H01R 12/718
                                                                439/513
  8,834,183 B2 *  9/2014  Komoto ................ H01R 12/71
                                                                439/507
  9,356,373 B2 *  5/2016  Komoto ............... H01R 12/772
  9,510,649 B1 *  12/2016 Liu ..................... A44B 17/0064
  9,577,374 B1 *  2/2017  Grant ....................... H01R 4/58
  9,627,804 B2 *  4/2017  Barth ...................... A41D 1/005
  9,642,398 B1 *  5/2017  Mason .................... A41D 1/005
  2002/0005342 A1 * 1/2002 Farringdon ............ A41D 1/002
                                                                200/511
  2004/0244193 A1 * 12/2004 Jung ...................... H05K 3/363
                                                                29/854
  2004/0259391 A1 * 12/2004 Jung .................... D03D 1/0082
                                                                439/37
  2005/0098421 A1 * 5/2005 Kohatsu ................. H01H 3/12
                                                                200/511
  2017/0112200 A1    4/2017  Mason et al.
  2017/0244208 A1 * 8/2017  Barth ...................... A41D 1/005
  2017/0279230 A1 * 9/2017  Komoto ................. H01R 13/73
  2017/0288338 A1 * 10/2017 Komoto ................. H01R 13/26
  2018/0233854 A1 * 8/2018  Komoto ................. H01R 12/69
  2019/0148901 A1 * 5/2019  Komoto ............. H01R 13/5219
                                                                439/271

* cited by examiner

CONNECTOR ATTACHED ON OPPOSITE SIDES OF GARMENT AND SANDWICHED BETWEEN CONNECTOR FIRST MEMBER AND CONNECTOR SECOND MEMBER

BACKGROUND OF THE INVENTION

The present invention relates to a connector, particularly to a connector to be attached to a garment in such a manner that a conductive member-installed attachment portion of the garment is sandwiched from the opposite sides by a first member and a second member of the connector.

In recent years, so-called wearable devices in which terminal devices such as various sensors and communication devices operate as being worn by a user have attracted attention. Such a wearable device is used as being mounted on a garment worn by a user for example; however, when the garment is washed or on other occasions, the wearable device is desired to be detached from the garment.

In order to detachably mount a wearable device on a garment, one method that has been proposed is attaching such a connector as disclosed by, for instance, JP 2017-182897 A to a garment and mounting a wearable device on the garment via the connector.

The connector disclosed by JP 2017-182897 A has a base member 1 in a circular disk shape and a frame member 2 in an annular shape as shown in FIG. 27. A plurality of contacts 3 are disposed in the base member 1. One end of each contact 3 is exposed on a surface of the base member 1 as a contact portion 3A, and the other end thereof forms a projection projecting from the surface of the base member 1 as an external connection portion 3B in the vicinity of the outer edge of the surface of the base member 1. The remaining portions of each contact 3 other than the contact portion 3A and the external connection portion 3B are embedded in the base member 1.

The frame member 2 has an opening portion 4 formed in the center, and the surface of the frame member 2 facing the base member 1 has a plurality of recesses (not shown) corresponding to the external connection portions 3B of the base member 1.

A garment 5 has an opening portion 6 of a similar size to the opening portion 4 of the frame member 2, and a plurality of conductive members 7 corresponding to the contacts 3 are attached to the rear surface of the garment 5. By firmly pressing the frame member 2 against the base member 1 with the garment 5 being sandwiched between the base member 1 and the frame member 2, the external connection portions 3B of the base member 1 are correspondingly fitted into the recesses of the frame member 2 as catching the conductive members 7 attached to the garment 5, whereby the contacts 3 are connected to the conductive members 7 and the connector is attached to the garment 5.

A wearable device (not shown) is inserted in the opening portion 4 of the frame member 2, thereby mounted on the connector, and consequently connected to the contact portions 3A of the contacts 3 exposed through the opening portion 6 of the garment 5 and the opening portion 4 of the frame member 2.

In the connector of JP 2017-182897 A, however, the garment 5 is, together with the conductive members 7, sandwiched between the external connection portions 3B of the base member 1 and the recesses of the frame member 2, and therefore, the garment 5 wrinkles disadvantageously.

There is another problem in that, when a conductive thread formed by twisting a plurality of fibrous conductors and covering the resulting thread with an insulating layer is used for the conductive members 7 of the garment 5, the conductive members 7 cannot be electrically connected to the contacts 3 only by fitting the external connection portions 3B of the base member 1 in the recesses of the frame member 2 such that the external connection portions 3B catch the conductive members 7, due to the presence of the insulating layer.

SUMMARY OF THE INVENTION

The present invention has been made to overcome the conventional problems as above and aims at providing a connector that can be mounted on a garment without causing wrinkles in the garment and that can be electrically connected to a conductive member of the garment even when the conductive member is made of a conductive thread.

A connector according to the present invention is one to be attached to a garment by sandwiching an attachment portion of the garment having a conductive member from opposite sides with a first member and a second member, wherein the first member has a first garment retaining portion of planar shape to be contacted with one surface of the attachment portion of the garment and a projection that is made of a conductive material, is disposed in a position different from a position of the first garment retaining portion and projects in a direction perpendicular to the first garment retaining portion, wherein the second member has a second garment retaining portion of planar shape to be contacted with the other surface of the attachment portion of the garment and a projection accommodating portion which is disposed in a position different from a position of the second garment retaining portion and into which the projection is fitted, wherein the projection has a slit extending in the direction perpendicular to the first garment retaining portion, and wherein when the projection is fitted into the projection accommodating portion, the projection is electrically connected to the conductive member of the garment.

DETAILED DESCRIPTION OF THE INVENTION

Embodiments of the present invention are described below based on the appended drawings.

Embodiment 1

Figure 1:
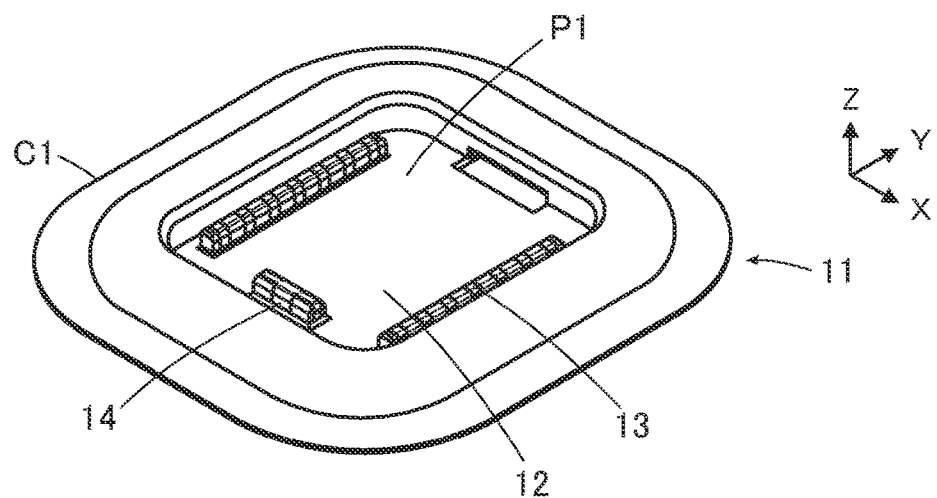
FIG. 1 is a perspective view showing a connector according to Embodiment 1 attached to a first garment.
Figure 2:
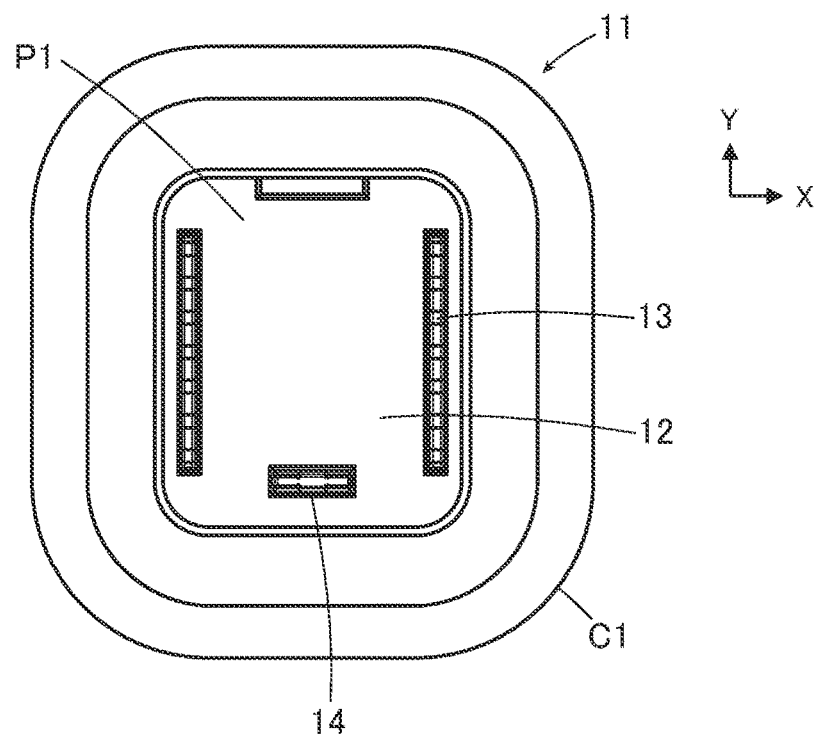
FIG. 2 is a plan view showing the connector according to Embodiment 1 attached to the first garment.

FIGS. 1 and 2 show a connector 11 according to Embodiment 1 attached to an attachment portion of a first garment C1. The connector 11 has a counter connector accommodating portion 12 of recess shape, and a plurality of contacts 13 made of a conductive metal sheet are aligned on a fitting surface P1, which is the bottom surface of the counter connector accommodating portion 12, in two rows along two straight lines parallel to each other. A locking portion 14 of convex shape is disposed on the fitting surface P1 between the two rows formed of the contacts 13 and near one ends of the rows.

For convenience, the direction in which the first contacts 13 are aligned in rows is called "Y direction," the direction along the fitting surface P1 and perpendicular to the Y direction is called "X direction," and the direction in which the fitting surface P1 faces is called "+Z direction."

The locking portion 14 is disposed near the −Y directional end of the fitting surface P1.

Figure 3:
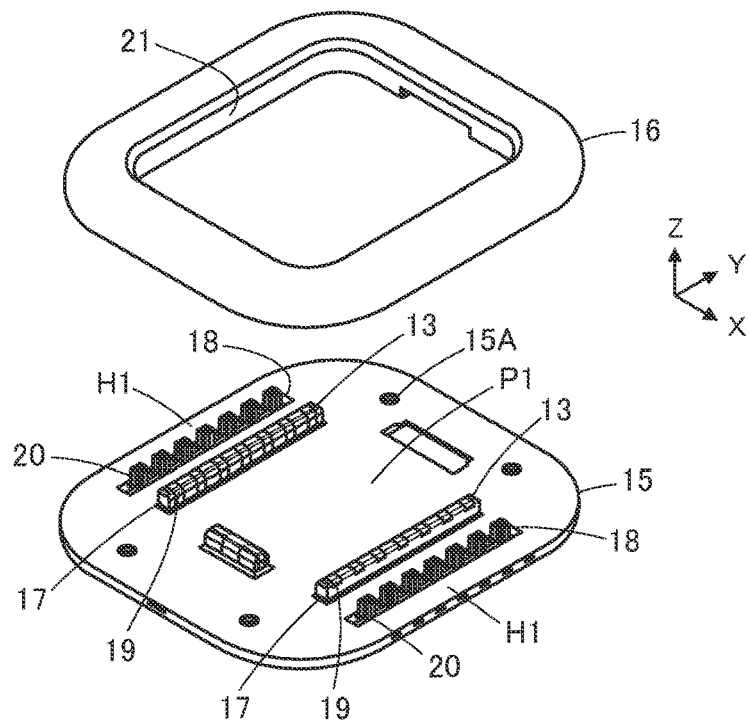
FIG. 3 is an exploded perspective view of the connector of Embodiment 1 as viewed from obliquely above.
Figure 4:
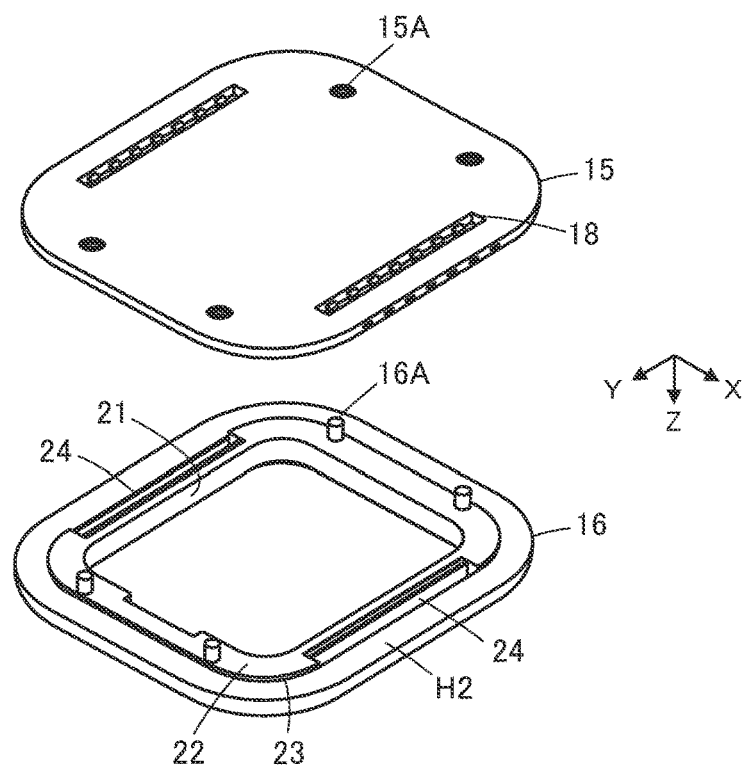
FIG. 4 is an exploded perspective view of the connector of Embodiment 1 as viewed from obliquely below.

FIGS. 3 and 4 show exploded perspective views of the connector 11. The connector 11 includes a base member (first member) 15 and a frame member (second member) 16 that sandwich the first garment C1 therebetween in the Z direction.

The base member 15 has a substantially flat plate shape, and the surface of the base member 15 on the +Z direction side forms the fitting surface P1. The base member 15 has two convex portions 17 that project in the +Z direction from the fitting surface P1, face each other in the X direction and extend in the Y direction. The base member 15 also has two openings 18 that penetrate the fitting surface P1 in the Z direction and extend in the Y direction in parallel to the corresponding convex portions 17 formed on the outer side of the two convex portions 17, that is, in positions closer to the lateral edge portions of the base member 15 than the convex portions 17 are.

The base member 15 further has a first garment retaining portion H1 extending along an XY plane formed in a peripheral edge portion of the base member 15 including regions on the outer side of the two openings 18 in the X direction.

The base member 15 further includes the contacts 13, and one end of each contact 13 is exposed on the surface of the convex portion 17 to form a contact portion 19 while the middle portion of each contact 13 forms a projection 20 projecting from the opening 18 in the +Z direction. The projections 20 are disposed in positions closer to the center of the base member 15 than the first garment retaining portion H1 is, that is, positions different from a position where the first garment retaining portion H1 is situated.

The base member 15 as above can be formed by joining the contacts 13 with insulating resin to be integral with each other by, for instance, insert molding.

The frame member 16 has an opening 21 formed in the center thereof. The inner periphery of the opening 21 and the fitting surface P1 of the base member 15 exposed through the opening 21 together form the counter connector accommodating portion 12 of recess shape shown in FIGS. 1 and 2.

The frame member 16 is provided, on its −Z direction-side surface, with a flat portion 22 that surrounds the opening 21 and extends along an XY plane and with a second garment retaining portion H2 that is formed on a peripheral edge portion of the frame member 16, which peripheral edge portion is situated on the outer side of the flat portion 22, to surround the flat portion 22 on the +Z direction side of the flat portion 22. A step portion 23 with a height corresponding to the thickness of the first garment C1 is formed between the flat portion 22 and the second garment retaining portion H2.

Further, the flat portion 22 has two projection accommodating portions 24 of recess shape that extend in the Y direction. The projection accommodating portions 24 are situated in positions closer to the opening 21 than the second garment retaining portion H2 is, that is, positions different from a position where the second garment retaining portion H2 is situated. These projection accommodating portions 24 are provided to accommodate the projections 20 of the contacts 13 that project in the +Z direction from the openings 18 of the base member 15.

The frame member 16 as above can be formed by, for instance, shaping insulating resin.

When four bosses 16A formed on the flat portion 22 of the frame member 16 are inserted in four insertion holes 15A formed in the base member 15, the base member 15 and the frame member 16 are joined to be integral with each other.

Figure 5:
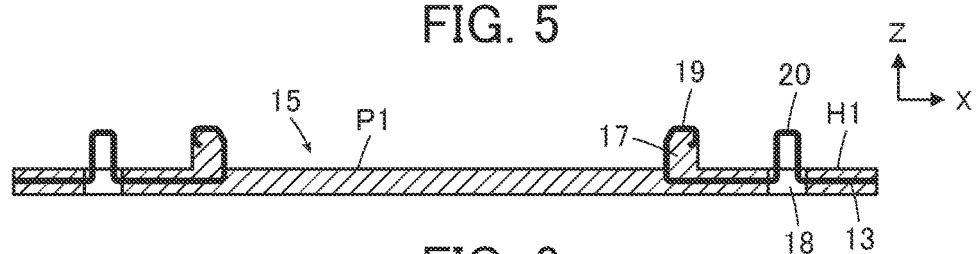
FIG. 5 is a cross-sectional view of a base member used in the connector of Embodiment 1.

As shown in FIG. 5, each contact 13 is disposed in the base member 15 such that the contact portion 19 and the projection 20 expose on the surface of the convex portion 17 and above the opening 18 and the remaining portions other than the contact portion 19 and the projection 20 are embedded in the base member 15.

Figure 6:
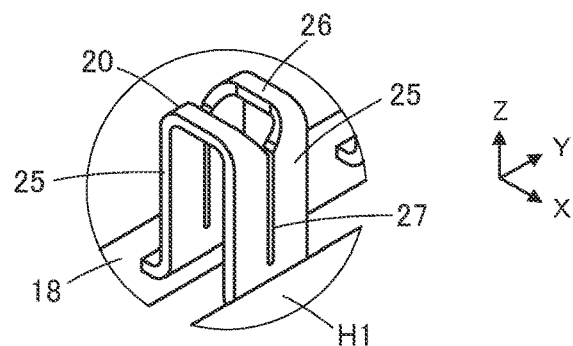
FIG. 6 is a perspective view showing a projection attached to the base member of the connector of Embodiment 1.

The projection 20 of the contact 13 is formed by bending a metal sheet constituting the contact 13 into a U shape so as to allow the projection 20 to have a pair of flat plate portions 25 that extend along a YZ plane in a direction perpendicular to the first garment retaining portion H1 and face each other in the X direction and a connecting portion 26 that extends along an XY plane and connects the +Z directional ends of the pair of flat plate portions 25, as shown in FIG. 6. The projection 20 further has a slit 27 that is formed continuously in the pair of flat plate portions 25 and the connecting portion 26 and extends along a XZ plane. The slit 27 is formed to have a slit width larger at the connecting portion 26 than at the pair of flat plate portions 25.

Now, the method of attaching the connector 11 to the first garment C1 is described.

Figure 7:
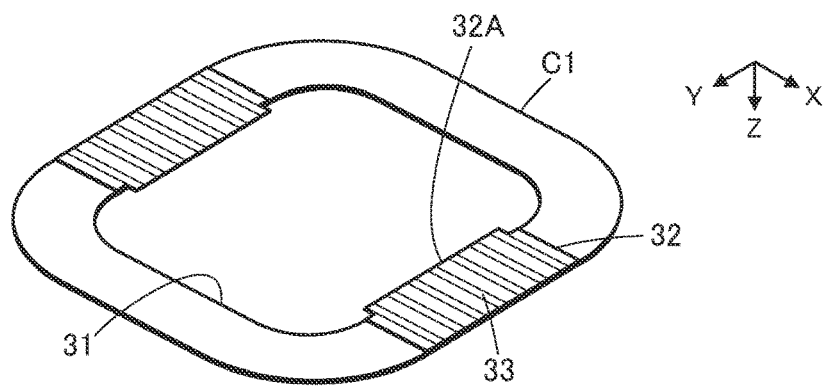
FIG. 7 is a perspective view showing an attachment portion of the first garment.

The attachment portion of the first garment C1 is shown in FIG. 7. The first garment C1 has an opening 31 for connector attachment, and conductive sheets 32 are bonded to the −Z direction-side surface of the first garment C1. Each conductive sheet 32 includes a plurality of conductive members 33 corresponding to the contacts 13 of the connector 11, and an end 32A of the conductive sheet 32, together with the conductive members 33, protrude inside the opening 31 of the first garment C1.

The opening 31 of the first garment C1 is set to have a shape that is substantially the same as the outer shape of the flat portion 22 of the frame member 16 and a size that is substantially the same as the outer size of the flat portion 22.

Figure 8:
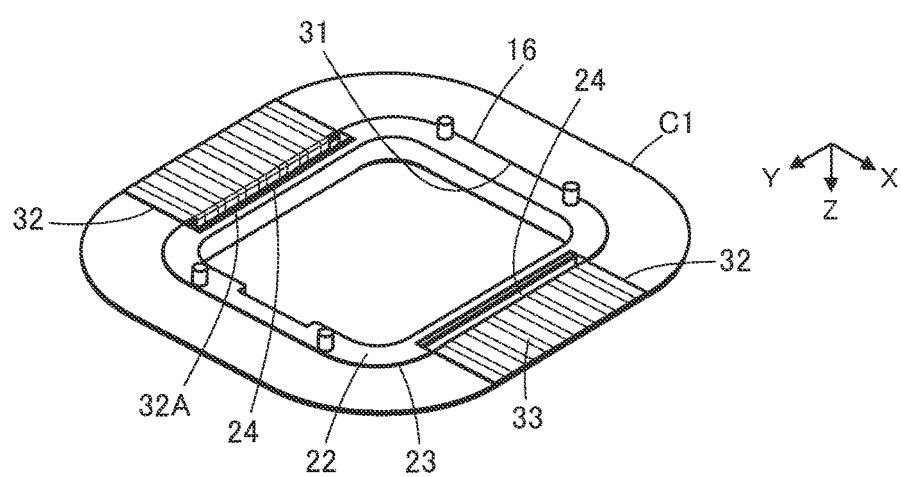
FIG. 8 is a perspective view of the state where the attachment portion of the first garment is disposed on a frame member, as viewed from obliquely below.
Figure 9:
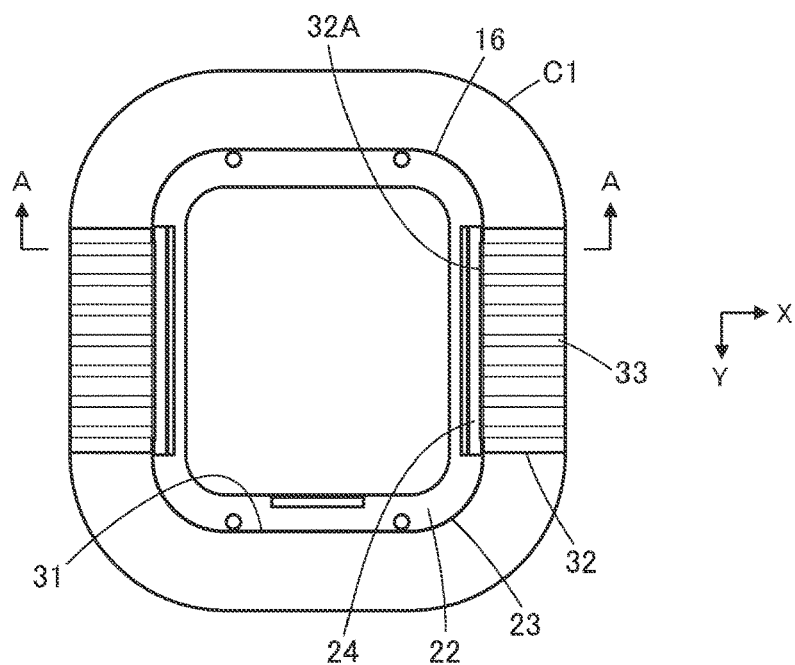
FIG. 9 is a bottom view of the state where the attachment portion of the first garment is disposed on the frame member, as viewed from below.
Figure 10:
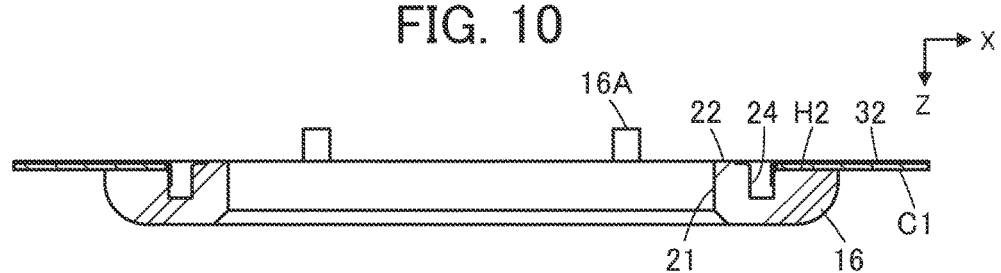
FIG. 10 is a cross-sectional view taken along line A-A in FIG. 9.

The attachment portion of the first garment C1 as above is placed on the −Z direction-side surface of the frame member 16 as shown in FIGS. 8 to 10. At this time, since the opening 31 of the first garment C1 has a shape that is substantially the same as the outer shape of the flat portion 22 of the frame member 16 and a size that is substantially the same as the outer size of the flat portion 22, the flat portion 22 of the frame member 16 is inserted in the opening 31 of the first garment C1, and on the +Z direction-side surface of the first garment C1, the edge of the first garment C1 along the opening 31 is situated on the second garment retaining portion H2 of the frame member 16 shown in FIG. 4.

Figure 11:
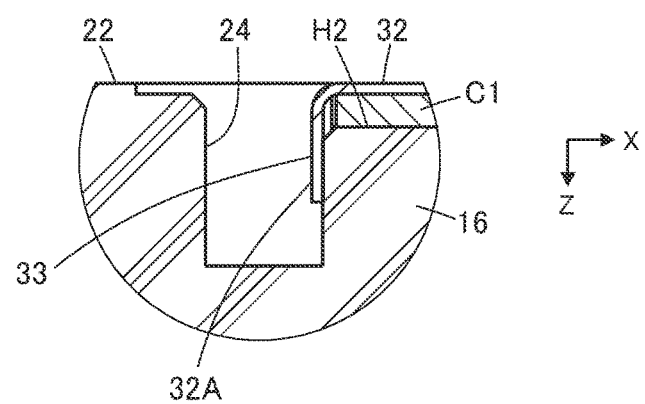
FIG. 11 is an enlarged view of an important part of FIG. 10.

Further, the ends 32A of the conductive sheets 32 protruding inside the opening 31 of the first garment C1 are bent in the +Z direction and inserted in the corresponding projection accommodating portions 24 of the frame member 16. Accordingly, as shown in FIG. 11, each of the conductive members 33 at the ends 32A of the conductive sheets 32 extends in the +Z direction along the inner surface of the corresponding projection accommodating portion 24 of the frame member 16.

Since the step portion 23 formed between the flat portion 22 and the second garment retaining portion H2 of the frame member 16 has a height corresponding to the thickness of the first garment C1, the flat portion 22 of the frame member 16 and the −Z direction-side surface of the first garment C1 form the substantially same plane.

Figure 12:
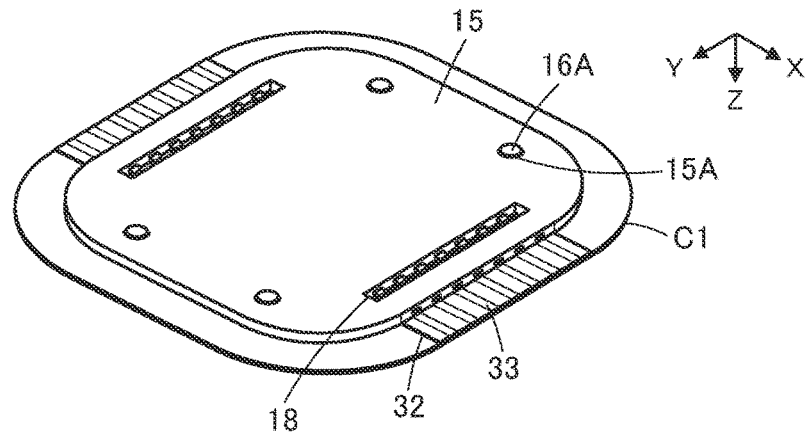
FIG. 12 is a perspective view of the state where the base member is disposed on the frame member with the attachment portion of the first garment being sandwiched therebetween, as viewed from obliquely below.
Figure 13:
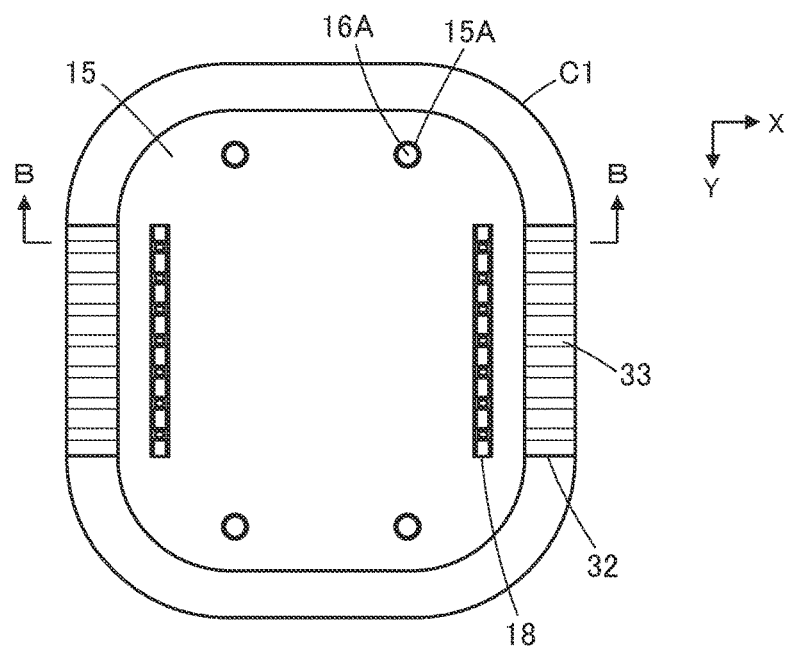
FIG. 13 is a bottom view of the state where the base member is disposed on the frame member with the attachment portion of the first garment being sandwiched therebetween, as viewed from below.

In this state, as shown in FIGS. 12 and 13, the base member 15 is placed on the first garment C1 from the −Z direction and pushed in the +Z direction. At this time, the four bosses 16A of the frame member 16 are inserted in the four insertion holes 15A of the base member 15, which allows the base member 15 to be positioned with respect to the frame member 16 and the first garment C1 and allows the projections 20 of the contacts 13 of the base member 15 to be inserted and fitted into the projection accommodating portions 24 of the frame member 16.

Thereafter, the heads of the bosses 16A of the frame member 16 that project in the −Z direction from the insertion holes 15A of the base member 15 are deformed by heat or the like. Thus, the attachment of the first garment C1 to the connector 11 is completed.

Figure 14:
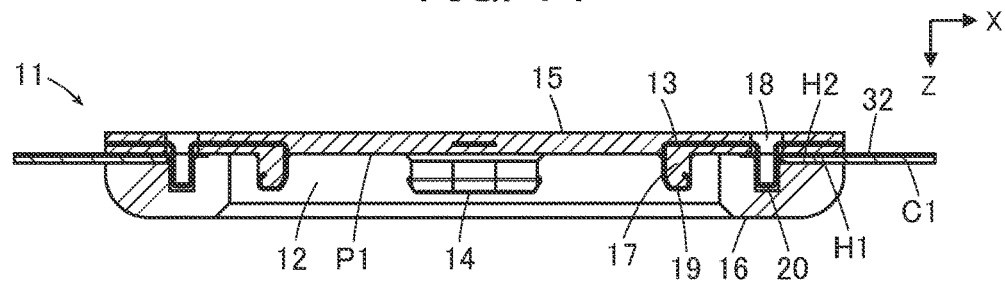
FIG. 14 is a cross-sectional view taken along line B-B in FIG. 13.

As shown in FIG. 14, the first garment C1 is, together with the conductive sheets 32, sandwiched between the first garment retaining portion H1 formed on the peripheral edge portion on the +Z direction-side surface of the base member 15 and the second garment retaining portion H2 formed on the peripheral edge portion on the −Z direction-side surface of the frame member 16, whereby the connector 11 is retained on the first garment C1.

The base member 15 and the frame member 16 form the counter connector accommodating portion 12 of recess shape, and the contact portions 19 of the contacts 13 are situated on the fitting surface P1, which is the bottom surface of the counter connector accommodating portion 12, and exposed on the surfaces of the convex portions 17.

Figure 15:
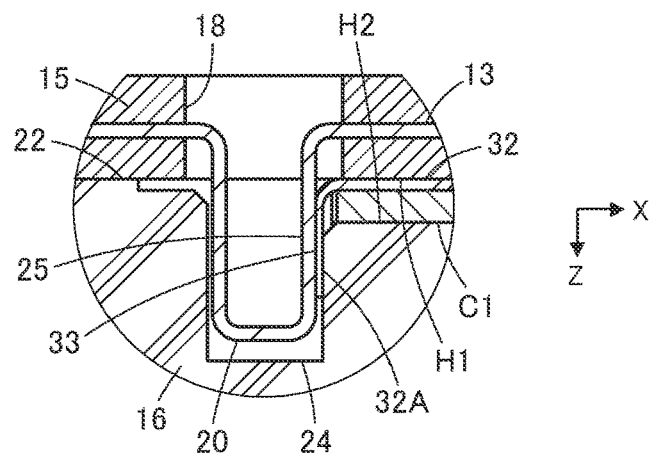
FIG. 15 is an enlarged view of an important part of FIG. 14.

As shown in FIG. 15, when the projection 20 of the contact 13 of the base member 15 is fitted into the projection accommodating portion 24 of the frame member 16, the conductive member 33 at the end 32A of the conductive sheet 32 extending in the +Z direction along the inner surface of the projection accommodating portion 24 is sandwiched between the inner surface of the projection accommodating portion 24 and the outer surface of the flat plate portion 25 of the projection 20 and contacts with the flat plate portion 25 of the projection 20. Thus, the contacts 13 are electrically connected to the conductive members 33 of the conductive sheets 32.

The first garment C1 is sandwiched between the first garment retaining portion H1 formed on the peripheral edge portion of the base member 15 on the outer side of the openings 18 in which the projections 20 of the contacts 13 penetrate and the second garment retaining portion H2 formed on the peripheral edge portion of the frame member 16 on the outer side of the flat portion 22 in which the projection accommodating portions 24 are provided, and the first garment C1 is not present, as its opening 31 is situated, on the inner side of the first garment retaining portion H1 and the second garment retaining portion H2. In other words, the projections 20 and the projection accommodating portions 24 are situated in positions different from the positions where the first garment retaining portion H1 and the second garment retaining portion H2 are situated. Therefore, even when the projections 20 of the contacts 13 of the base member 15 are fitted into the projection accommodating portions 24 of the frame member 16, the first garment C1 does not wrinkle.

Figure 16:
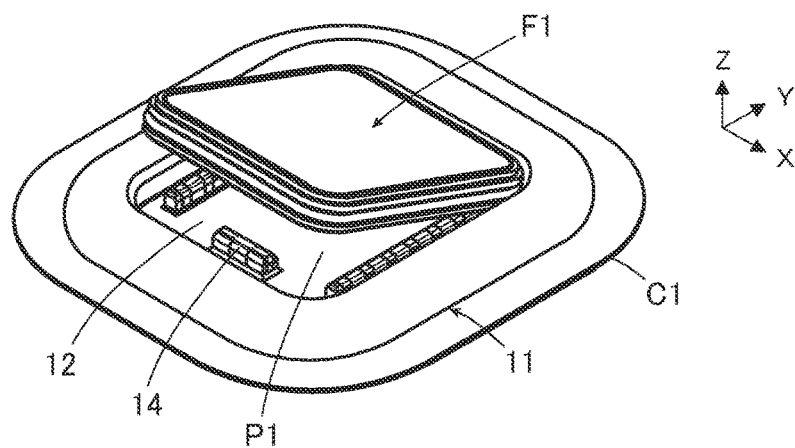
FIG. 16 is a perspective view showing the state where a counter connector is being fitted to the connector of Embodiment 1.

The connector 11 according to Embodiment 1 is fitted with a counter connector F1 by inserting the counter connector F1 into the counter connector accommodating portion 12 as shown in FIG. 16. After one end of the counter connector F1 is inserted in the counter connector accommodating portion 12, the other end thereof is pushed toward the fitting surface P1, whereby the counter connector F1 is fitted with the connector 11.

When the connector 11 and the counter connector F1 are fitted with each other, the contact portions 19 of the contacts 13 of the base member 15 contact with a plurality of contacts (not shown) of the counter connector F1, and the contacts of the counter connector F1 are electrically connected to the conductive members 33 of the conductive sheets 32 of the first garment C1.

In addition, the locking portion 14 of the connector 11 catches on a locked portion (not shown) of the counter connector F1, and thus, the fitting state between the connector 11 and the counter connector F1 is locked.

In the first garment C1 shown in FIG. 7, the ends 32A of the conductive sheets 32, together with the conductive members 33, protrude inside the opening 31 of the first garment C1, and as shown in FIG. 15, the first garment C1 is not inserted in the projection accommodating portion 24 of the frame member 16 while only the end 32A of the conductive sheet 32 is inserted in the projection accommodating portion 24; however, the invention is not limited thereto.

Figure 17:
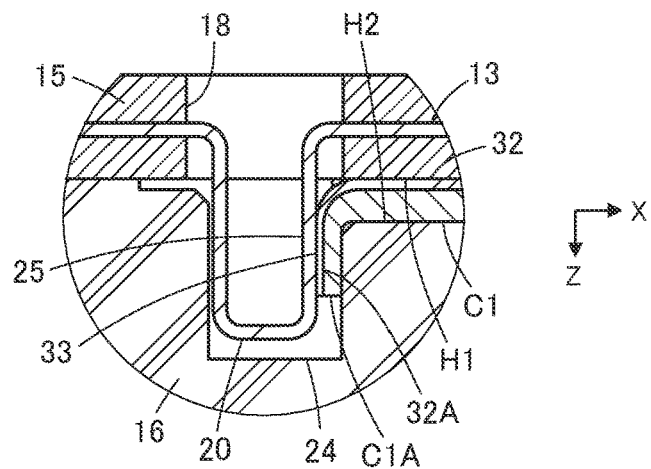
FIG. 17 is an enlarged cross-sectional view of an important part when the base member is disposed on the frame member of a connector according to a modification of Embodiment 1 with the attachment portion of the first garment being sandwiched therebetween.

For instance, as shown in FIG. 17, an end C1A of the first garment C1 may extend to the end 32A of the conductive sheet 32 such that the end 32A of the conductive sheet 32 is, together with the end C1A of the first garment C1, inserted in the projection accommodating portion 24 of the frame member 16. This configuration also allows the conductive members 33 at the ends 32A of the conductive sheets 32 to contact with the flat plate portions 25 of the projections 20, thereby electrically connecting the contacts 13 to the conductive members 33 of the conductive sheets 32.

The end C1A of the first garment C1 merely extends in the +Z direction along the inner surface of the projection accommodating portion 24 of the frame member 16 and does not extend over the projection 20 to reach the inner side of the first garment retaining portion H1 and the second garment retaining portion H2; therefore, even when the projections 20 are fitted into the projection accommodating portions 24, the first garment C1 can be prevented from wrinkling.

Figure 18:
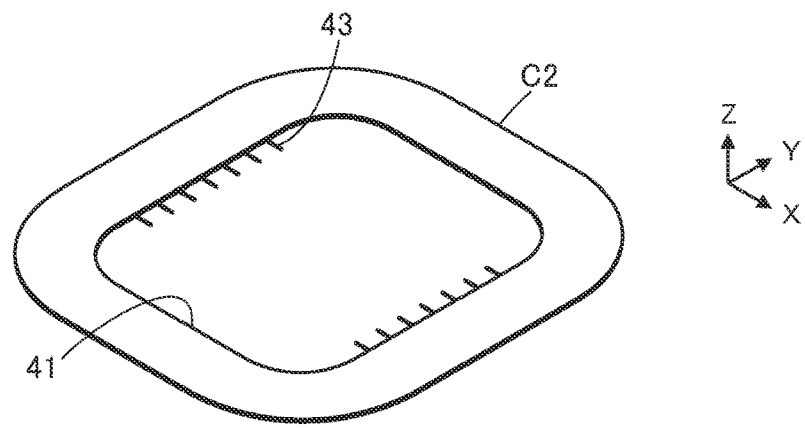
FIG. 18 is a perspective view of an attachment portion of a second garment as viewed from obliquely above.
Figure 19:
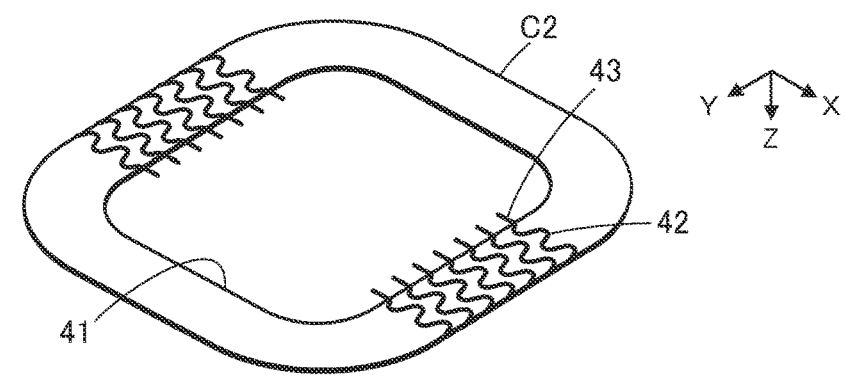
FIG. 19 is a perspective view of the attachment portion of the second garment as viewed from obliquely below.

The connector 11 according to Embodiment 1 may be attached not only to the first garment C1 to which the conductive sheets 32 are bonded as shown in FIG. 7 but also to a second garment C2 to which a plurality of conductive threads 42 are sewn as shown in FIGS. 18 and 19.

The second garment C2 has an opening 41 for connector attachment, and the conductive threads 42 are sewn to the −Z direction-side surface of the second garment C2. Ends 43 of the conductive threads 42 protrude inside the opening 41.

The conductive threads 42 herein are defined to be ones each formed by twisting a plurality of fibrous conductors and covering the resulting thread with an insulating layer.

The method of attaching the connector 11 to the second garment C2 is described.

Figure 20:
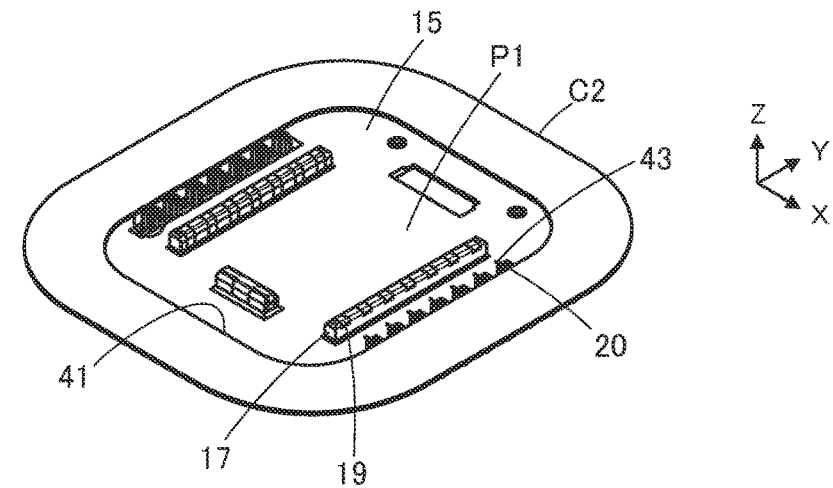
FIG. 20 is a perspective view of the state where the attachment portion of the second garment is disposed on the base member, as viewed from obliquely above.
Figure 21:
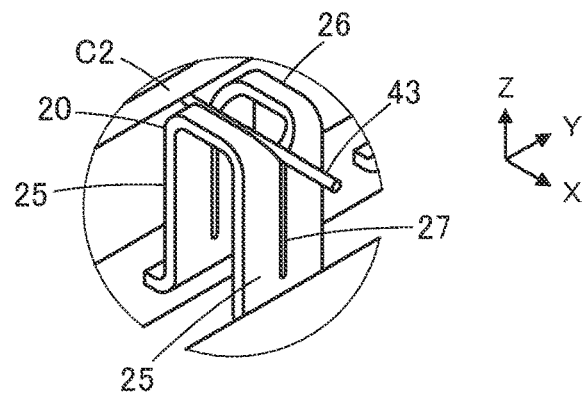
FIG. 21 is an enlarged view of an important part of FIG. 20.

First, as shown in FIG. 20, the attachment portion of the second garment C2 is placed on the +Z direction-side surface of the base member 15 such that the ends 43 of the conductive threads 42 protruding inside the opening 41 of the second garment C2 are positioned on the projections 20 of the base member 15. At this time, as shown in FIG. 21, the end 43 of the conductive thread 42 is disposed in the slit 27 formed in the connecting portion 26 of the projection 20 so as to traverse the upper portions of the pair of flat plate portions 25 of the projection 20 and protrude in the X direction. The slit 27 formed continuously in the pair of flat plate portions 25 and the connecting portion 26 has a width larger than the diameter of the end 43 of the conductive thread 42 at the connecting portion 26 and a width slightly smaller than the diameter of the end 43 of the conductive thread 42 at the flat plate portions 25.

In this state, the frame member 16 is placed on the base member 15 from the +Z direction, and the four bosses 16A of the frame member 16 shown in FIG. 4 are inserted in the four insertion holes 15A of the base member 15. Thus, the frame member 16 is positioned with respect to the base member 15 and the second garment C2, and the projection accommodating portions 24 of the frame member 16 are laid from the +Z direction to cover the projections 20 of the contacts 13 of the base member 15.

Figure 22:
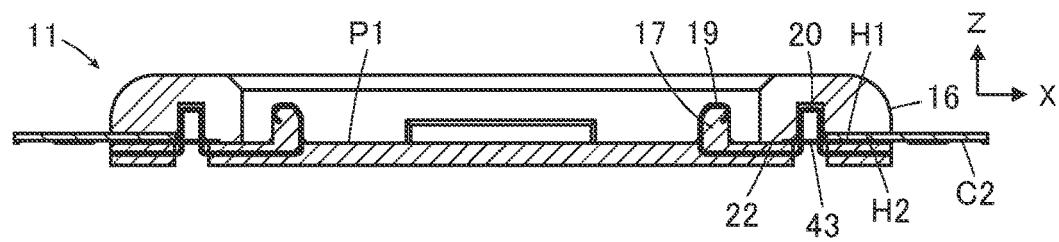
FIG. 22 is a cross-sectional view showing the state where the frame member is disposed on the base member of the connector according to Embodiment 1 with the attachment portion of the second garment being sandwiched therebetween.

When the frame member 16 is pushed toward the base member 15 in the −Z direction, the projections 20 of the contacts 13 of the base member 15 are fitted into the projection accommodating portions 24 of the frame member 16, while the frame member 16 pushes the second garment C2 and the ends 43 of the conductive threads 42 in the −Z direction, as shown in FIG. 22.

Figure 23:
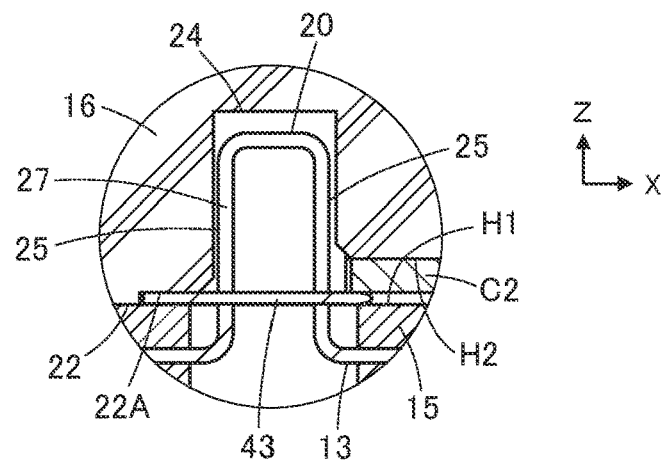
FIG. 23 is an enlarged view of an important part of FIG. 22.

More specifically, as shown in FIG. 23, the second garment retaining portion H2 of the frame member 16 contacts with the +Z direction-side surface of the second garment C2 and pushes the second garment C2 in the −Z direction, while a step 22A formed in a region of the flat portion 22 adjacent to the projection accommodating portion 24 of the frame member 16 pushes, in the −Z direction, the end 43 of the conductive thread 42 protruding from the projection 20 in the X direction, whereby the end 43 of the conductive thread 42 is inserted up to the vicinity of the −Z directional ends of the slit 27 formed in the pair of flat plate portions 25 of the projection 20.

At this time, since the slit 27 formed in the flat plate portions 25 of the projection 20 has a width slightly smaller than the diameter of the end 43 of the conductive thread 42, when the end 43 of the conductive thread 42 is pushed to the vicinity of the −Z directional ends of the slit 27 formed in the pair of flat plate portions 25, the insulating layer covering the end 43 of the conductive thread 42 is rubbed with the inner surface of the slit 27 and thereby peeled off, so that the plurality of conductors twisted to constitute the conductive thread 42 contact with the inner surface of the slit 27. Thus, the contacts 13 are electrically connected to the conductive threads 42 of the second garment C2.

Figure 24:
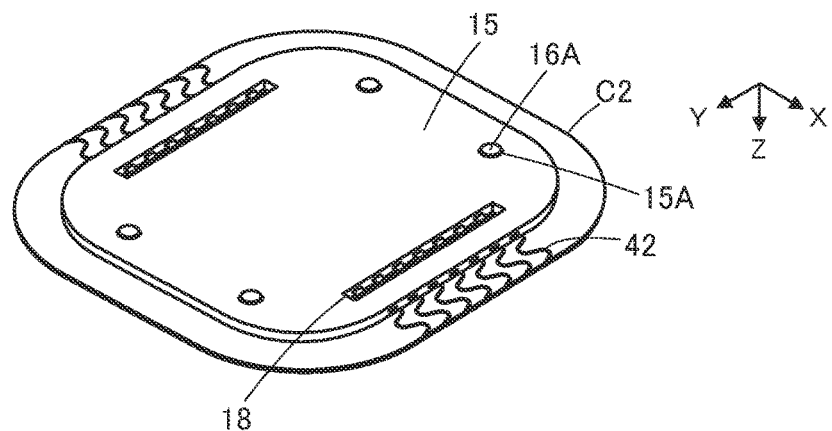
FIG. 24 is a perspective view of the state where the frame member is disposed on the frame member with the attachment portion of the second garment being sandwiched therebetween, as viewed from obliquely below.

As shown in FIG. 24, the heads of the bosses 16A of the frame member 16 that project in the −Z direction from the insertion holes 15A of the base member 15 are deformed by heat or the like. Thus, the attachment of the second garment C2 to the connector 11 is completed.

Similarly to the attachment of the connector 11 to the first garment C1, the second garment C2 is sandwiched between the first garment retaining portion H1 formed on the peripheral edge portion of the base member 15 on the outer side of the openings 18 in which the projections 20 of the contacts 13 penetrate and the second garment retaining portion H2 formed on the peripheral edge portion of the frame member 16 on the outer side of the flat portion 22 in which the projection accommodating portions 24 are provided, and the second garment C2 is not present, as its opening 41 is situated, on the inner side of the first garment retaining portion H1 and the second garment retaining portion H2. In other words, the projections 20 and the projection accommodating portions 24 are situated in positions different from the positions where the first garment retaining portion H1 and the second garment retaining portion H2 are situated. Therefore, even when the projections 20 of the contacts 13 of the base member 15 are fitted into the projection accommodating portions 24 of the frame member 16, the second garment C2 does not wrinkle.

While, in Embodiment 1, the first contacts 13 are aligned on the fitting surface P1 of the connector 11 in two rows along two straight lines parallel to each other, the invention is not limited thereto, and the contacts 13 may be aligned in one or three or more rows. The number of the contacts 13 is not limited to that illustrated in the drawings.

Embodiment 2

While the connector 11 according to Embodiment 1 is fitted to the counter connector F1 by inserting the counter connector F1 into the counter connector accommodating portion 12 as shown in FIG. 16, the invention is not limited thereto.

Figure 25:
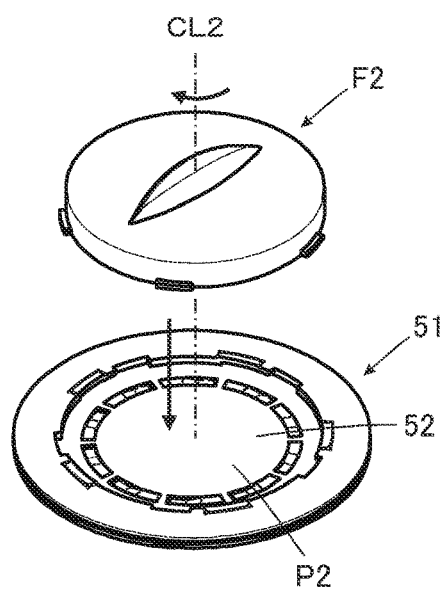
FIG. 25 is a perspective view showing a connector according to Embodiment 2.

For instance, a connector 51 according to Embodiment 2 shown in FIG. 25 includes a counter connector accommodating portion 52 of substantially circular shape and a fitting surface P2 which is the bottom surface of the counter connector accommodating portion 52. A counter connector F2 of substantially circular disk shape is fitted to the connector 51 by inserting the counter connector F2 in the counter connector accommodating portion 52 and rotating and sliding the counter connector F2 about a rotational axis CL2 along the fitting surface P2.

By application of this invention, the connector 51 of rotating and sliding type as above can also be attached to a garment without causing wrinkles in the garment, and even when a conductive thread is used for a conductive member of the garment, the connector 51 can be electrically connected to the conductive member as well.

Embodiment 3

Figure 26:
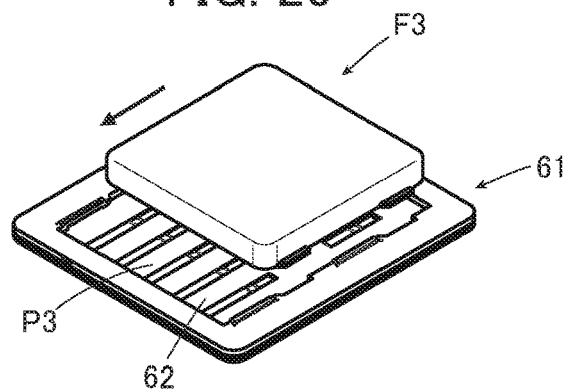
FIG. 26 is a perspective view showing a connector according to Embodiment 3.
Figure 27:
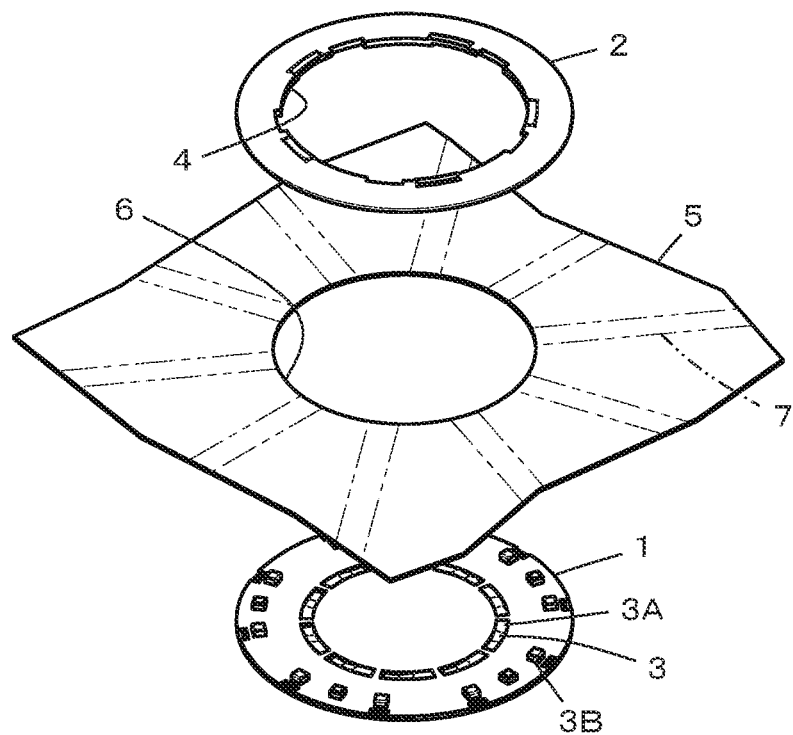
FIG. 27 is a perspective view showing the state where a conventional connector is being attached to a garment.

FIG. 26 shows a connector 61 according to Embodiment 3. The connector 61 includes a counter connector accommodating portion 62 of substantially rectangular shape and a fitting surface P3 which is the bottom surface of the counter connector accommodating portion 62. A counter connector F3 of substantially rectangular plate shape is fitted to the connector 61 by inserting the counter connector F3 in the counter connector accommodating portion 62 and linearly sliding the counter connector F3 along the fitting surface P3.

By application of this invention, the connector 61 of linearly sliding type as above can also be attached to a garment without causing wrinkles in the garment, and even when a conductive thread is used for a conductive member of the garment, the connector 61 can be electrically connected to the conductive member as well.

What is claimed is:

1. A connector to be attached to a garment by sandwiching an attachment portion of the garment having a conductive member from opposite sides with a first member and a second member,
   wherein the first member has a first garment retaining portion of planar shape to be contacted with one surface of the attachment portion of the garment and a projection that is made of a conductive material, is disposed in a position different from a position of the first garment retaining portion and projects in a direction perpendicular to the first garment retaining portion,
   wherein the second member has a second garment retaining portion of planar shape to be contacted with the other surface of the attachment portion of the garment and a projection accommodating portion which is disposed in a position different from a position of the second garment retaining portion and into which the projection is fitted,
   wherein the projection has a slit extending in the direction perpendicular to the first garment retaining portion,
   wherein the projection is formed from a metal sheet bent into a U shape to have a pair of flat plate portions that extend in the direction perpendicular to the first garment retaining portion and face each other and a connecting portion that connects ends of the pair of flat plate portions to each other,
   wherein the slit is formed continuously in the pair of flat plate portions and the connecting portion, and
   wherein when the projection is fitted into the projection accommodating portion, the projection is electrically connected to the conductive member of the garment.

2. The connector according to claim 1,
   wherein the first member has a plurality of the projections aligned in two rows, and the second member has a pair of the projection accommodating portions, and
   wherein the first garment retaining portion is disposed on an outer side of the plurality of the projections, and the second garment retaining portion is disposed on an outer side of the pair of the projection accommodating portions.

3. The connector according to claim 1,
   wherein both or one of the first garment retaining portion and the second garment retaining portion include a step portion corresponding to a thickness of the garment.

4. The connector according to claim 1,
   wherein the first member has a contact made of a conductive material and including the projection, and
   wherein the contact has a contact portion to be contacted with a contact of a counter connector.

5. The connector according to claim 4,
   wherein the second member is in a frame shape having in its center an opening for accommodating the counter connector, and
   wherein when the projection of the first member is fitted into the projection accommodating portion of the second member, the contact portion of the contact is situated within the opening of the second member.

6. The connector according to claim 1,
   wherein the conductive member is disposed in a conductive sheet bonded to the garment, and
   wherein when the projection is fitted into the projection accommodating portion with the conductive sheet being sandwiched between an inner surface of the projection accommodating portion and an outer surface of the projection, a surface of the conductive member contacts with the outer surface of the projection, so that the projection is electrically connected to the conductive member.

7. The connector according to claim 1,
   wherein the conductive member is made of a conductive thread that is formed by covering a conductor with an insulating layer and is sewn to the garment, and
   wherein when the projection is fitted into the projection accommodating portion with the conductive thread being inserted in the slit of the projection, the insulating layer of the conductive thread is peeled off with an inner surface of the slit to contact the conductor with the inner surface of the slit, so that the projection is electrically connected to the conductive member.

* * * * *